(12) United States Patent
Eun et al.

(10) Patent No.: US 8,391,076 B2
(45) Date of Patent: Mar. 5, 2013

(54) NONVOLATILE MEMORY DEVICE USING INTERLEAVING TECHNOLOGY AND PROGRAMMING METHOD THEREOF

(75) Inventors: Hee Seok Eun, Hwaseong-si (KR); Yong June Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 185 days.

(21) Appl. No.: 13/040,626

(22) Filed: Mar. 4, 2011

(65) Prior Publication Data

US 2011/0216590 A1    Sep. 8, 2011

(30) Foreign Application Priority Data

Mar. 8, 2010   (KR) .................. 10-2010-0020488

(51) Int. Cl.
 *G11C 16/04*     (2006.01)
(52) U.S. Cl. ......... 365/185.24; 365/185.02; 365/185.03; 365/185.28
(58) Field of Classification Search .............. 365/185.24
See application file for complete search history.

(56) References Cited

U.S. PATENT DOCUMENTS

| | | | | |
|---|---|---|---|---|
| 7,558,109 B2 * | 7/2009 | Brandman et al. | ....... | 365/185.03 |
| 8,085,599 B2 * | 12/2011 | Cho et al. | ................. | 365/185.24 |
| 8,139,406 B2 * | 3/2012 | Park et al. | ................ | 365/185.02 |
| 2011/0051521 A1 * | 3/2011 | Levy et al. | ............... | 365/185.19 |

FOREIGN PATENT DOCUMENTS

KR    10-2009-0042108 A    4/2009

* cited by examiner

*Primary Examiner* — Son Mai
(74) *Attorney, Agent, or Firm* — Lee & Morse, P.C.

(57) ABSTRACT

A nonvolatile memory device using interleaving technology is provided. The nonvolatile memory device includes a first controller configured to allocate one of $2^N$ threshold voltage states to N-bit data where N is 2 or a natural number greater than 2, a second controller configured to set a difference between adjacent threshold voltage states among the $2^N$ threshold voltage states so that the difference increases as a threshold voltage increases, and a programming unit configured to form a threshold voltage distribution state corresponding to the allocated threshold voltage state and to program the N-bit data to a multi-level cell. The second controller controls the difference between the adjacent threshold voltage states to equalize the number of read errors for all intersections among the $2^N$ threshold voltage states at the end of life.

20 Claims, 12 Drawing Sheets

NONVOLATILE MEMORY DEVICE USING INTERLEAVING TECHNOLOGY AND PROGRAMMING METHOD THEREOF

REFERENCE TO RELATED APPLICATIONS

This application claims priority under 35 U.S.C. §119 to Korean Patent Application No. 10-2010-0020488, filed on Mar. 8, 2010, in the Korean Intellectual Property Office, and entitled: "Nonvolatile Memory Device Using Interleaving Technology and Programming Method Thereof," which is incorporated by reference herein in its entirety.

BACKGROUND

1. Field

Embodiments relate to a nonvolatile memory device, and more particularly, to a nonvolatile memory device using interleaving technology and a programming method thereof.

2. Description of the Related Art

Single-level cell (SLC) memory stores data of one bit in a single memory cell. SLC memory is also referred to as single-bit cell (SBC) memory. Data of one bit is written to and read from SLC memory by a voltage belonging to one of two distributions distinguished by a threshold voltage programmed to a memory cell.

Programmed threshold voltages form a distribution in a predetermined range due to a minute electrical characteristic difference between single level cells. For instance, when a voltage read from a memory cell is 0.5 to 1.5 volts it may be determined that data stored in the memory cell has a logic value of "1". When a voltage read from a memory cell is 2.5 to 3.5 volts, it may be determined that data stored in the memory cell has a logic value of "0".

Data stored in a memory cell is classified depending on the difference between memory cell currents/voltages during a read operation. Meanwhile, multi-level cell (MLC) memory that stores data of two or more bits in a single memory cell has been proposed in response to a need for higher integration of memory. MLC memory may also be referred to as a multi-bit cell (MBC) memory.

However, as the number of bits stored in a single memory cell increases, reliability may deteriorate and the read-failure rate may increase. To program "m" bits in a single memory cell, $2^m$ distributions may be required to be formed. However, since the voltage window of a memory may be limited, the difference in a threshold voltage between adjacent bits may decrease as "m" increases, which may increase the read failure rate.

For instance, as for multi-level flash memory, the number of errors at the end of life (EOL) is influenced a lot by the arrangement of threshold voltage states after programming operations. When m-bit multi-level flash memory is programmed using a gray code, the number of read operations for each page increases exponentially by a power of 2, that is, 1, 2, 4, 8 and so on. The difference in the number of read operations between pages may cause a bit error rate (BER) to be different from page to page.

Approaches for adjusting a verify-read voltage have been proposed to equalize a BER for all pages at the EOL in order to guarantee the reliability. However, it is difficult to adjust the verify-read voltage so that every page has the same BER at the EOL. It is more difficult as the number of threshold voltage states increases.

SUMMARY

One or more embodiments may provide a nonvolatile memory device using interleaving technology to reduce and/or minimize a number of total errors at the end of life (EOL), thereby increasing reliability at the EOL, and a programming method thereof.

One or more embodiments may provide a nonvolatile memory device using interleaving technology, the nonvolatile memory device including a first controller configured to allocate one of $2^N$ threshold voltage states to N-bit data where N is 2 or a natural number greater than 2, a second controller configured to set a difference between adjacent threshold voltage states among the $2^N$ threshold voltage states so that the difference increases as a threshold voltage increases, and a programming unit configured to form a threshold voltage distribution state corresponding to the allocated threshold voltage state and to program the N-bit data to a multi-level cell. The second controller may control the difference between the adjacent threshold voltage states to equalize the number of read errors for all intersections among the $2^N$ threshold voltage states at the end of life.

The second controller may control the difference between the adjacent threshold voltage states based on a characteristic of threshold voltage shift of the multi-level cell at the end of life.

The second controller may control the difference between the adjacent threshold voltage states considering a change in a threshold voltage distribution state corresponding to each threshold voltage state, which occurs based on at least one among coupling effect and program disturbance by other threshold voltage states.

Also, the second controller may control a difference between a lowest threshold voltage state and its adjacent threshold voltage state considering a change in a threshold voltage distribution state of the lowest threshold voltage state, which occurs based on a coupling effect and/or program disturbance by other threshold voltage states.

The nonvolatile memory device may be a flash memory including a plurality of multi-level cells.

The first controller may allocate one of the $2^N$ threshold voltage states to the N-bit data using gray coding.

The nonvolatile memory device may further include a verification unit configured to compare a threshold voltage of the multi-level cell with a verify-read voltage and to verify whether the threshold voltage distribution state corresponding to the allocated threshold voltage state has been formed. At this time, the second controller may control the difference between the adjacent threshold voltage states by adjusting the verify-read voltage.

The nonvolatile memory device may further include a detection unit configured to compare a threshold voltage of the multi-level cell with a detected voltage and to detect a threshold voltage shift characteristic of the multi-level cell and a verify-read voltage controller configured to change a verify-read voltage for the multi-level cell based on the threshold voltage shift characteristic of the multi-level cell.

The above-described nonvolatile memory device may be combined with a memory controller configured to control data exchange between the nonvolatile memory device and a host to realize a memory system.

One or more embodiments may provide a programming method of a nonvolatile memory device using interleaving technology. The programming method includes the operations of allocating one of $2^N$ threshold voltage states to N-bit data where N is 2 or a natural number greater than 2, setting a difference between adjacent threshold voltage states among the $2^N$ threshold voltage states so that the difference increases as a threshold voltage increases, and programming the N-bit data to a multi-level cell by forming a threshold voltage distribution state corresponding to the allocated threshold voltage state.

The operation of setting the difference between the adjacent threshold voltage states may include controlling the difference between the adjacent threshold voltage states to equalize the number of read errors for all intersections among the $2^N$ threshold voltage states at the end of life. The operation of setting the difference between the adjacent threshold voltage states may include controlling the difference between the adjacent threshold voltage states based on a characteristic of threshold voltage shift of the multi-level cell at the end of life.

The operation of setting the difference between the adjacent threshold voltage states may include controlling the difference between the adjacent threshold voltage states considering a change in a threshold voltage distribution state corresponding to each threshold voltage state, which occurs based on at least one among coupling effect and program disturbance by other threshold voltage states.

The operation of setting the difference between the adjacent threshold voltage states may include controlling a difference between a lowest threshold voltage state and its adjacent threshold voltage state considering a change in a threshold voltage distribution state of the lowest threshold voltage state, which occurs based on at least among coupling effect and program disturbance by other threshold voltage states.

The nonvolatile memory device may be a flash memory including a plurality of multi-level cells.

The operation of allocating one of the $2^N$ threshold voltage states may include allocating one of the $2^N$ threshold voltage states to the N-bit data using gray coding. At this time, the programming method may further include the operation of comparing a threshold voltage of the multi-level cell with a verify-read voltage and verifying whether the threshold voltage distribution state corresponding to the allocated threshold voltage state has been formed. At this time, the operation of setting the difference between the adjacent threshold voltage states may include controlling the difference between the adjacent threshold voltage states by adjusting the verify-read voltage.

The programming method may further include the operations of comparing a threshold voltage of the multi-level cell with a detected voltage and detecting a threshold voltage shift characteristic of the multi-level cell; and changing a verify-read voltage for the multi-level cell based on the threshold voltage shift characteristic of the multi-level cell.

The programming method may be implemented by executing a computer program for performing a method of booting a computer system, which is stored in a non-transitory computer readable recording medium.

BRIEF DESCRIPTION OF THE DRAWINGS

Features of embodiments will become more apparent by describing in detail exemplary embodiments thereof with reference to the attached drawings in which.

DETAILED DESCRIPTION

Figure 1:
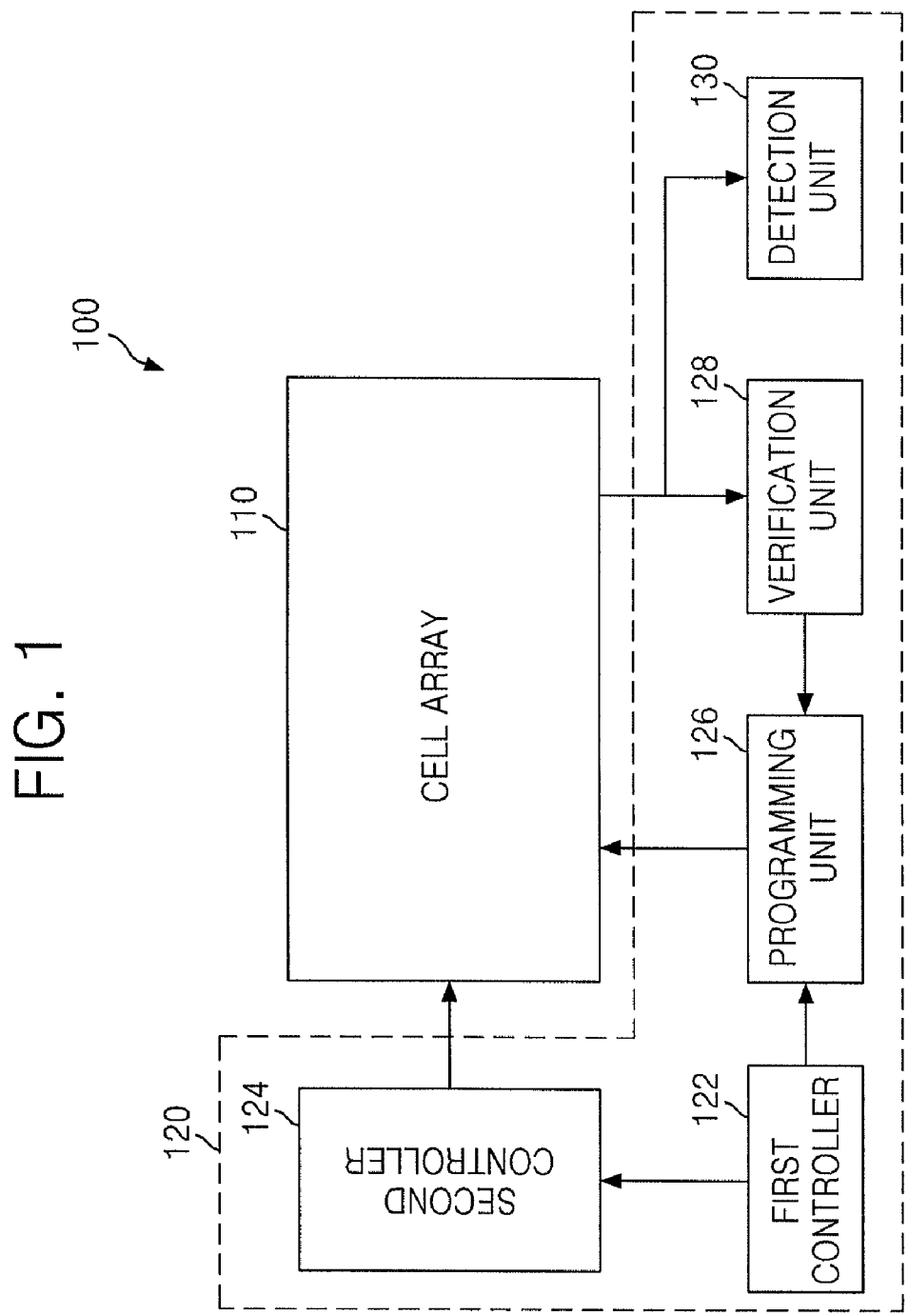
FIG. 1 illustrates a block diagram of an exemplary embodiment of a nonvolatile memory device.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

As used herein, the term "and/or" includes any and all combinations of one or more of the associated listed items and may be abbreviated as "/". It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a block diagram of an exemplary embodiment of a nonvolatile memory device 100. The nonvolatile memory device 100 may be a multi-level flash memory device based on storing charges, but embodiments are not restricted thereto. The nonvolatile memory device 100 may use interleaving technology for substantially and/or completely equalizing a number of errors for all pages at the end of life (EOL). Interleaving technology mixes bits of data that have been read from memory cells and decoded to make the number of errors occurring in all pages the same.

The nonvolatile memory device 100 may include a cell array 110 and a program block 120. The cell array 110 may include a plurality of memory cells, i.e., multi-level cells (not shown) arranged in a matrix form. Each of the memory cells may store data of N bits, where N is 2 or a natural number greater than 2.

The program block 120 may include a first controller 122, a second controller 124, a programming unit 126, a verification unit 128, and a detection unit 130. The program block 120 may perform a programming operation on the memory cells included in the cell array 110. The program block 120 may arrange threshold voltage states of the memory cells in order to maximize reliability at the EOL. The first controller 122 may allocate one of $2^N$ threshold voltage states to N-bit data. For instance, the first controller 122 may arrange threshold voltage stages corresponding to N-bit data using a gray code.

When the threshold voltage states are arranged using the gray code, only one bit is different and the rest of bits are the same between two data respectively corresponding to two adjacent threshold voltage states. For instance, when N is 4 and data corresponding to a first threshold voltage state is "0000", data corresponding to a threshold voltage state adjacent to the first threshold voltage state may be "1000", "0100", "0010", or "0001" that has only one different bit from the bits corresponding to the data "0000" of the first threshold voltage state.

The second controller 124 may increase the difference between adjacent threshold voltage states among the $2^N$ threshold voltage states as a threshold voltage increases. The second controller 124 may control the difference between adjacent threshold voltage states to completely and/or substantially equalize the number of data read errors for all intersections of the $2^N$ threshold voltage states at the EOL. In other words, the second controller 124 may control the difference between adjacent threshold voltage states based on the change of a threshold voltage distribution state corresponding to each threshold voltage state, which may occur based on, e.g., the threshold voltage shift of each multi-level cell and/or program disturbance by other threshold voltage states at the EOL.

The programming unit 126 may form a threshold voltage distribution state corresponding to the allocated threshold voltage state and program the N-bit data to a multi-level cell.

Referring to FIG. 1, the verification unit 128 may compare a threshold voltage of each multi-level cell with a verify-read voltage and verify whether a distribution state corresponding to a threshold voltage state allocated to multi-bit data has been formed. More particularly, e.g., each of $2^N$ threshold voltage states may have a corresponding verify-read voltage. The verification unit 128 may feed a verification result back to the programming unit 126 and the programming unit 126 may determine whether to perform an additional programming operation on a multi-bit cell according to the verification result.

When a threshold voltage measured at a multi-bit cell is lower than a verify-read voltage, the verification unit 128 may verify that a distribution state corresponding to a threshold voltage state allocated to the multi-bit cell has not been formed and may feed the verification result back to the programming unit 126. The programming unit 126 may perform an additional programming operation on the multi-bit cell on which it has been verified that the distribution state has not been formed. More particularly, the threshold voltage of the multi-bit cell, on which the additional programming operation has been performed by the programming unit 126, may increase. In this way, the programming unit 126 may perform a unit programming operation until distribution states corresponding to threshold voltage states allocated to all multi-bit cells within a page are formed.

The second controller 124 may adjust the distribution states formed by the programming unit 126 by adjusting a verify-read voltage. At this time, the second controller 124 may adjust the difference between threshold voltage states by adjusting the difference between verify-read voltages.

The detection unit 130 may compare a threshold voltage of a multi-level cell with a detected voltage and detect the characteristic of threshold voltage shift of the multi-level cell. A verify-read voltage controller (not shown) may change the verify-read voltage for the multi-level cell based on the threshold voltage shift characteristic. In other words, the verify-read voltage controller may perform read voltage tracking by which an optimal voltage is set considering the change in the threshold voltage of the multi-level cell.

Figure 2:
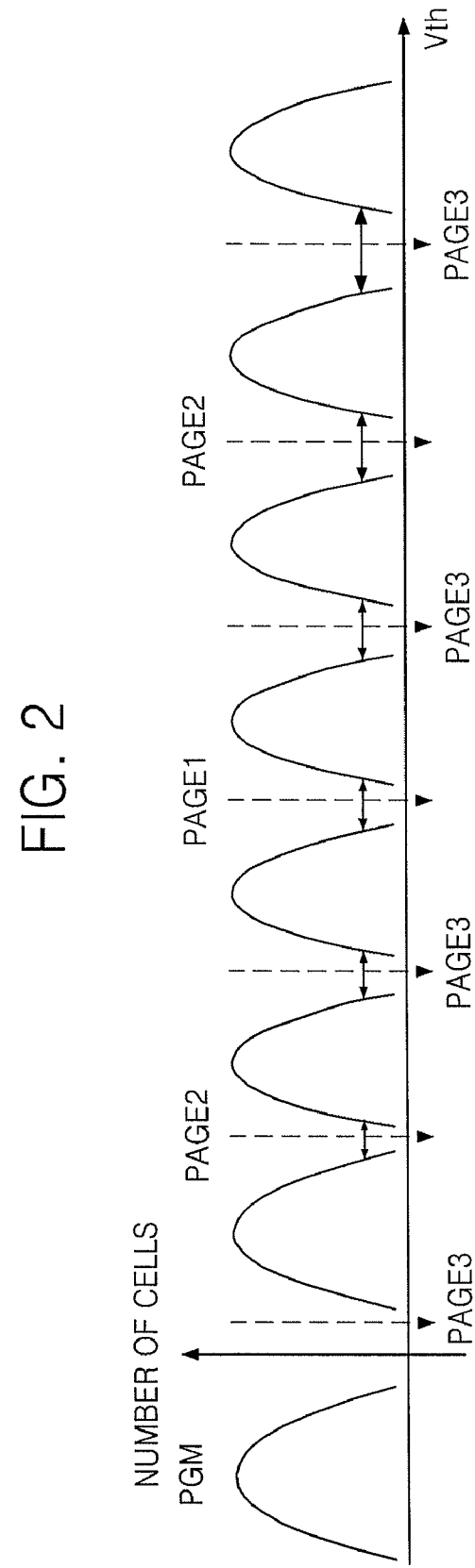
FIG. 2 illustrates a graph of exemplary threshold voltage states of multi-level cells right after a programming operation of the nonvolatile memory device illustrated in FIG. 1.

FIG. 2 illustrates a graph of threshold voltage states of multi-level cells right after a programming operation (denoted by PGM) of the nonvolatile memory device 100 illustrated in FIG. 1. Referring to the example of FIG. 2, the difference between threshold voltages of multi-level cells increases as the threshold voltage increases. More particularly, referring to FIG. 2, a shift amount of a threshold voltage state may increase over time as the threshold voltage increases.

Referring to FIGS. 1 and 2, the second controller 124 may control the difference between the lowest threshold voltage state and its adjacent threshold voltage state further based on, e.g., coupling effect and/or program disturbance by other threshold voltage states. A threshold voltage state corresponding to a lower threshold voltage may be susceptible to more influence from the coupling effect and the program disturbance from other threshold voltage states. In one or more embodiments, such features may be considered and employed in controlling the difference between the lowest threshold voltage state and its adjacent threshold voltage state. Accordingly, one or more of embodiments may provide a nonvolatile memory device, e.g., 100, having increased and/or improved reliability relative to comparable conventional memory devices.

Figure 3:
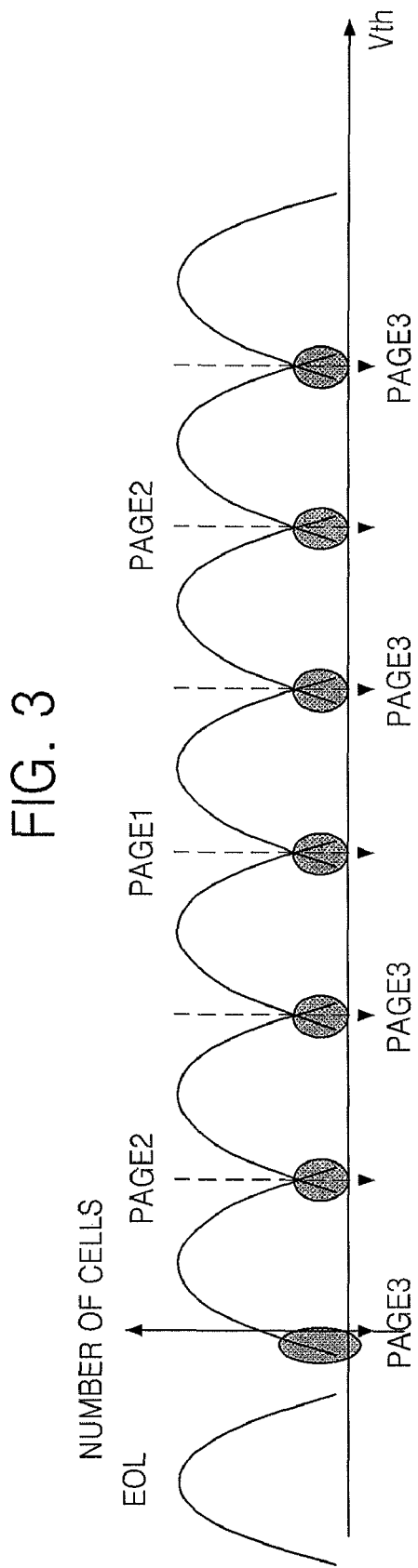
FIG. 3 illustrates a graph of threshold voltage states of multi-level cells at the end of life (EOL) of the nonvolatile memory device illustrated in FIG. 1.

FIG. 3 illustrates a graph showing threshold voltage states of multi-level cells at the EOL of the nonvolatile memory device 100 illustrated in FIG. 1. Referring to FIG. 3, the intersections between adjacent threshold voltage states may have the same area at the EOL. As described above, an area of an intersection indicates an error that can be calculated from the statistical characteristic of the distribution of respective threshold voltage states. Thus, when the areas of intersections of the threshold voltage states are the same, a read error rate corresponding to all threshold voltage states may be the same.

In one or more embodiments, the second controller 124 may control the differences between the threshold voltage states to equalize the number of read errors for all threshold voltage states at the EOL. The second controller 124 may minimize the total number of read errors occurring with respect to each threshold voltage state. By controlling the threshold voltage states and reducing and/or minimizing a number of read errors relative to the threshold states, one or more embodiments may provide more reliable nonvolatile memory devices, e.g., 100, relative to comparable conventional devices.

As described above, in order to equalize the number of read errors for all threshold voltage states at the EOL, an accurate estimation of the threshold voltage shift of multi-level cells at the EOL may be necessary. The estimation of the threshold voltage shift of multi-level cells may be performed through modeling using factors influencing the threshold voltage shift as stochastic parameters, and taking the endurance and retention of the multi-level cells into consideration. Stochastic parameters may include, e.g., the number of program/erase cycles for a cell and the amount of lost charges for the cell, but embodiments are not restricted to such parameters. When the distribution of threshold voltages is actually determined at the initial stage using modeling, the distribution of threshold voltages at the EOL may be predicted. Accordingly, an optimal verify-read voltage at the EOL may be estimated at the optimized initial stage.

Figure 4:
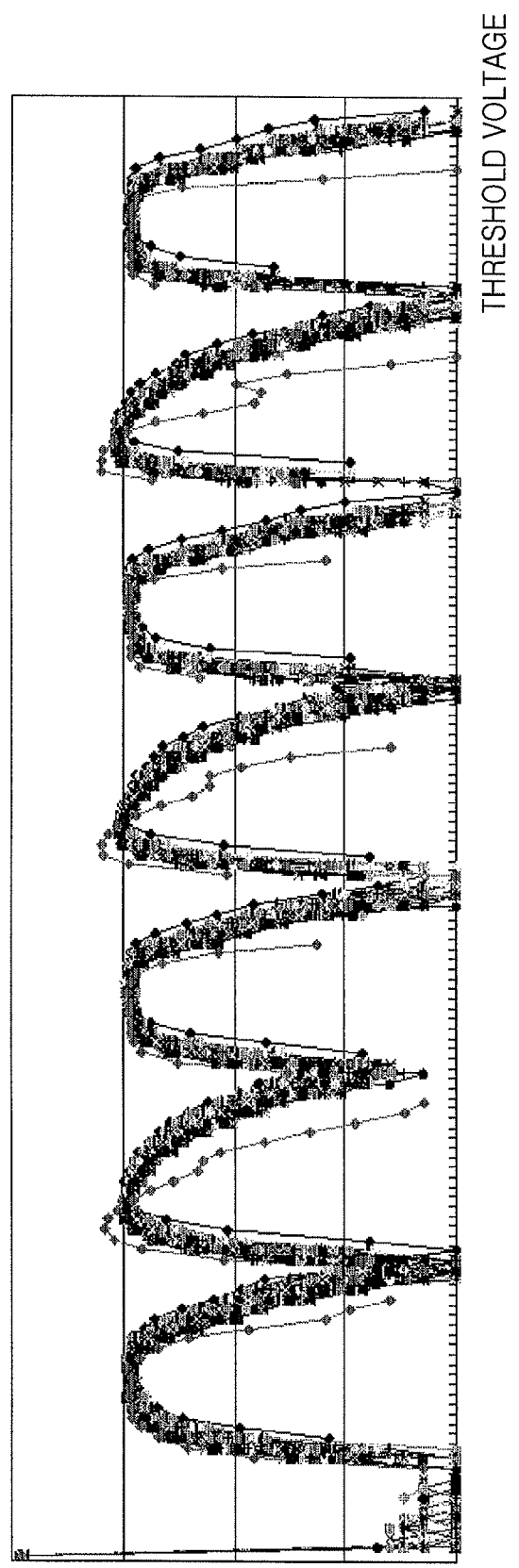
FIG. 4 illustrates a graph of a distribution of threshold voltages throughout a single block of a NAND flash memory in an initial stage.
Figure 5:
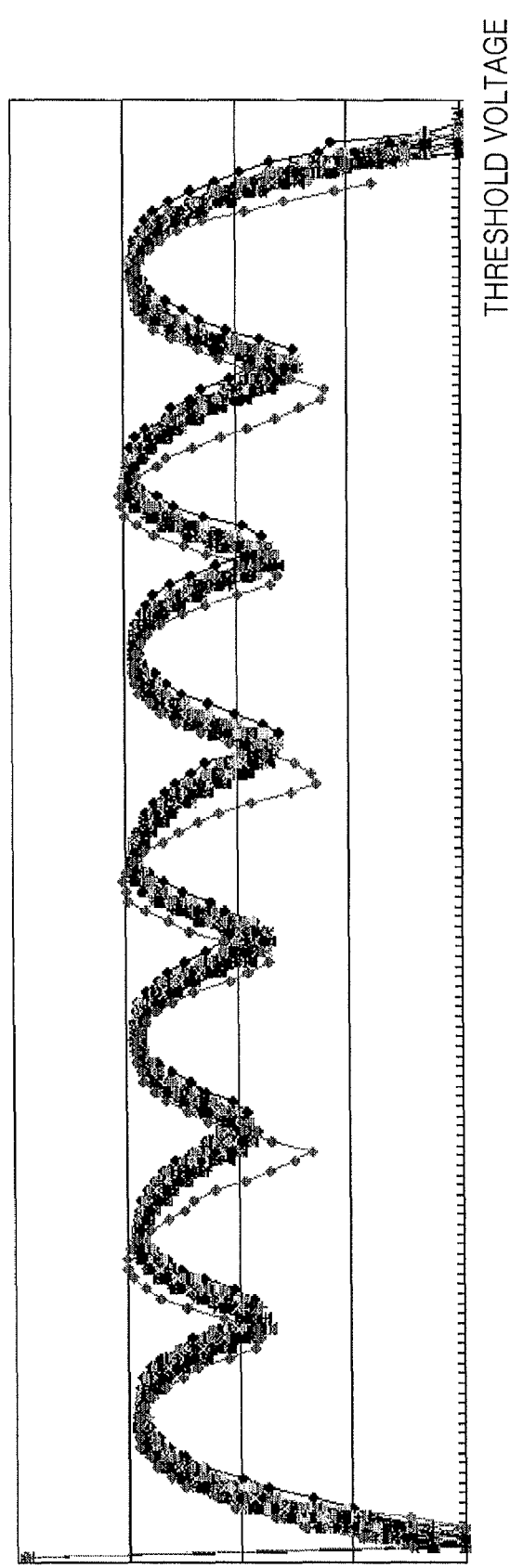
FIG. 5 illustrates a graph showing a result of modeling threshold voltage shift at the EOL, that is, the distribution of threshold voltages at the EOL based on the distribution of the initial threshold voltages illustrated in FIG. 4.

FIG. 4 illustrates a graph of the distribution of threshold voltages throughout a single block of a NAND flash memory at the initial stage. FIG. 4 illustrates a graph of a result of modeling threshold voltage shift at the EOL based on the distribution of initial threshold voltages shown in FIG. 4. More particularly, FIG. 5 illustrates the distribution of threshold voltages at the EOL based on the exemplary distribution of the initial threshold voltages illustrated in FIG. 4. Embodiments may employ an improved and/or accurate modeling technology that considers physical characteristics of multi-level cells, and may provide an improved and/or accurate estimate of the distribution of threshold voltages appearing at the EOL, and therefore, one or more embodiments may enable a bit error rate (BER) to be better and/or accurately estimated.

Figure 6:
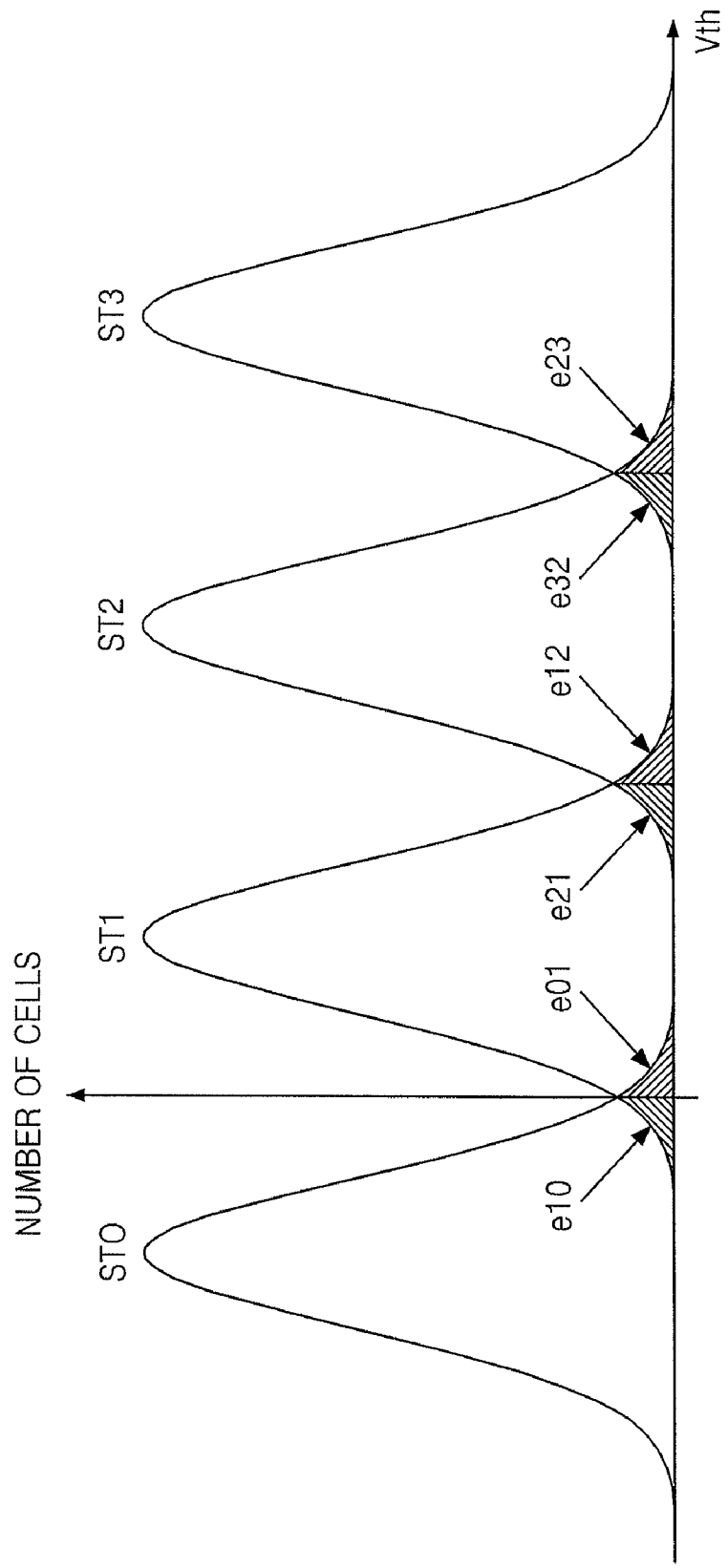
FIG. 6 illustrates a graph showing threshold voltage states at the EOL of a 2-bit multi-level nonvolatile memory device according to one or more embodiments.

FIG. 6 illustrates a graph showing threshold voltage states at the EOL of an exemplary 2-bit multi-level nonvolatile memory device according to one or more embodiments. Referring to FIG. 6, the probability of incorrectly regarding a particular threshold voltage state as an adjacent threshold voltage state may be the same as the probability of incorrectly regarding the adjacent threshold voltage state as the particular threshold voltage state in each intersection at the EOL. Furthermore, all intersections (i.e., regions where errors occur) may have the same area.

In detail, a probability e01 of incorrectly regarding a lowest threshold voltage state ST0 as a first threshold voltage state ST1 is the same as a probability e10 of incorrectly regarding the first threshold voltage state ST1 as the lowest threshold voltage state ST0. A probability e12 of incorrectly regarding the first threshold voltage state ST1 as a second threshold voltage state ST2 is the same as a probability e21 of incorrectly regarding the second threshold voltage state ST2 as the first threshold voltage state ST1. A probability e23 of incorrectly regarding the second threshold voltage state ST2 as a third threshold voltage state ST3 is the same as a probability e32 of incorrectly regarding the third threshold voltage state ST3 as the second threshold voltage state ST2. In one or more embodiments, an error occurrence probability (e01+e10) at an intersection between the lowest threshold voltage state ST0 and the first threshold voltage state ST1, an error occurrence probability (e12+e21) at an intersection between the first threshold voltage state ST1 and the second threshold voltage state ST2, and an error occurrence probability (e23+e32) at an intersection between the second threshold voltage state ST2 and the third threshold voltage state ST3 may all be the same.

In one or more embodiments, each threshold voltage state at the EOL may be assumed to be a Gaussian distribution and a BER at an intersection between adjacent threshold voltage states may be mathematically derived from this assumption. The Gaussian distribution of threshold voltages at the EOL may be a distribution estimated by modeling the threshold voltage shift described above.

A Gaussian distribution corresponding to each threshold voltage state is expressed by Equation (1):

$$f_{S_i}(x) = \frac{N}{2^m} \cdot \frac{1}{\sqrt{2\pi}\,\sigma_i} \exp\left[-\frac{(x-\mu_i)^2}{2\sigma_i^2}\right]. \qquad \text{Equation (1)}$$

In Equation (1), $f_{S_i}$ is the Gaussian distribution corresponding to an i-th threshold voltage state, i.e., the probability density function of the i-th threshold voltage state; N is the total number of cells; "m" is the number of bits that can be stored in each cell; $\mu_i$ is the mean of the Gaussian distribution; and $\sigma_i$ is the standard deviation of the Gaussian distribution.

A BER at the intersection between adjacent threshold voltage states, in which some of cells in the i-th threshold voltage state are misread to be in a j-th threshold voltage state, is expressed by Equation (2):

$$BER = \frac{\sum_{i,j \in \{|i-j|=1\}} e_{i,j}}{Nm} = \frac{1}{Nm}\sum_{i=0}^{2^m-2}(e_{i,i+1}+e_{i+1,i}). \qquad \text{Equation (2)}$$

In Equation (2), $$\sum_{i,j \in \{|i-j|=1\}} e_{i,j}$$

is the number of cells misread to be in the j-th threshold voltage state among the cells in the i-th threshold voltage state, $e_{i,i+1}$ is the number of cells misread to be in an (i+1)-th threshold voltage state among the cells in the i-th threshold voltage state, and $e_{i+1,i}$ is the number of cells misread to be in the i-th threshold voltage state among the cells in the (i+1)-th threshold voltage state. A probability of misreading a current threshold voltage state as other threshold voltage states different by at least two than the current threshold voltage state may be nearly zero. Therefore, in one or more embodiments, only the threshold voltage state directly adjacent to the i-th threshold voltage state may be considered, and threshold voltage states different by 2 or more than the i-th threshold voltage state may not be considered. Embodiments are not however limited thereto.

The number of cells misread to be in the (i+1)-th threshold voltage state among the cells in the i-th threshold voltage state, i.e., $e_{i,i+1}$ may be expressed by Equation (3):

$$e_{i,i+1} = \int_{\mu_i+\Delta_{i,r}}^{\infty} f_{S_i}(x)dx \quad \text{Equation (3)}$$

$$= \frac{N}{2^m} \int_{\mu_i+\Delta_{i,r}}^{\infty} \frac{1}{\sqrt{2\pi}\,\sigma_i} \exp\left[-\frac{(x-\mu_i)^2}{2\sigma_i^2}\right] dx$$

$$= \frac{N}{2^m} \int_{\Delta_{i,r}}^{\infty} \frac{1}{\sqrt{2\pi}\,\sigma_i} \exp\left[-\frac{(x)^2}{2\sigma_i^2}\right] dx$$

$$= \frac{N}{2^m} \int_{\frac{\Delta_{i,r}}{\sqrt{2}\,\sigma_i}}^{\infty} \frac{1}{\sqrt{\pi}} \exp(-t^2) dx \left( \because \frac{x}{2\sigma_i} = t,\, dx = \sqrt{2}\,\sigma_i dt \right)$$

$$= \frac{N}{2^m} \cdot \frac{1}{2} \operatorname{erfc}\left(\frac{\Delta_{i,r}}{\sqrt{2}\,\sigma_i}\right) \left( \because \operatorname{erfc}(x) = \frac{2}{\sqrt{\pi}} \int_x^{\infty} \exp(-t^2) dt \right)$$

In Equation (3), $\Delta_{i,r}$ is a distance between the center of a distribution corresponding to the i-th threshold voltage state and the center of the intersection between the i-th threshold voltage state and the (i+1)-th threshold voltage state and "erfc" is a complementary error function.

The number of cells misread to be in the i-th threshold voltage state among the cells in the (i+1)-th threshold voltage state, i.e., $e_{i+1,i}$ may be expressed by Equation (4):

$$e_{i+1,i} = \frac{N}{2^m} \cdot \frac{1}{2} \operatorname{erfc}\left(\frac{\Delta_{i+1,1}}{\sqrt{2}\,\sigma_{i+1}}\right). \quad \text{Equation (4)}$$

In Equation (4), $\Delta_{i+1,i}$ is a distance between the center of a distribution corresponding to the (i+1)-th threshold voltage state and the center of the intersection between the i-th threshold voltage state and the (i+1)-th threshold voltage state.

Figure 7:
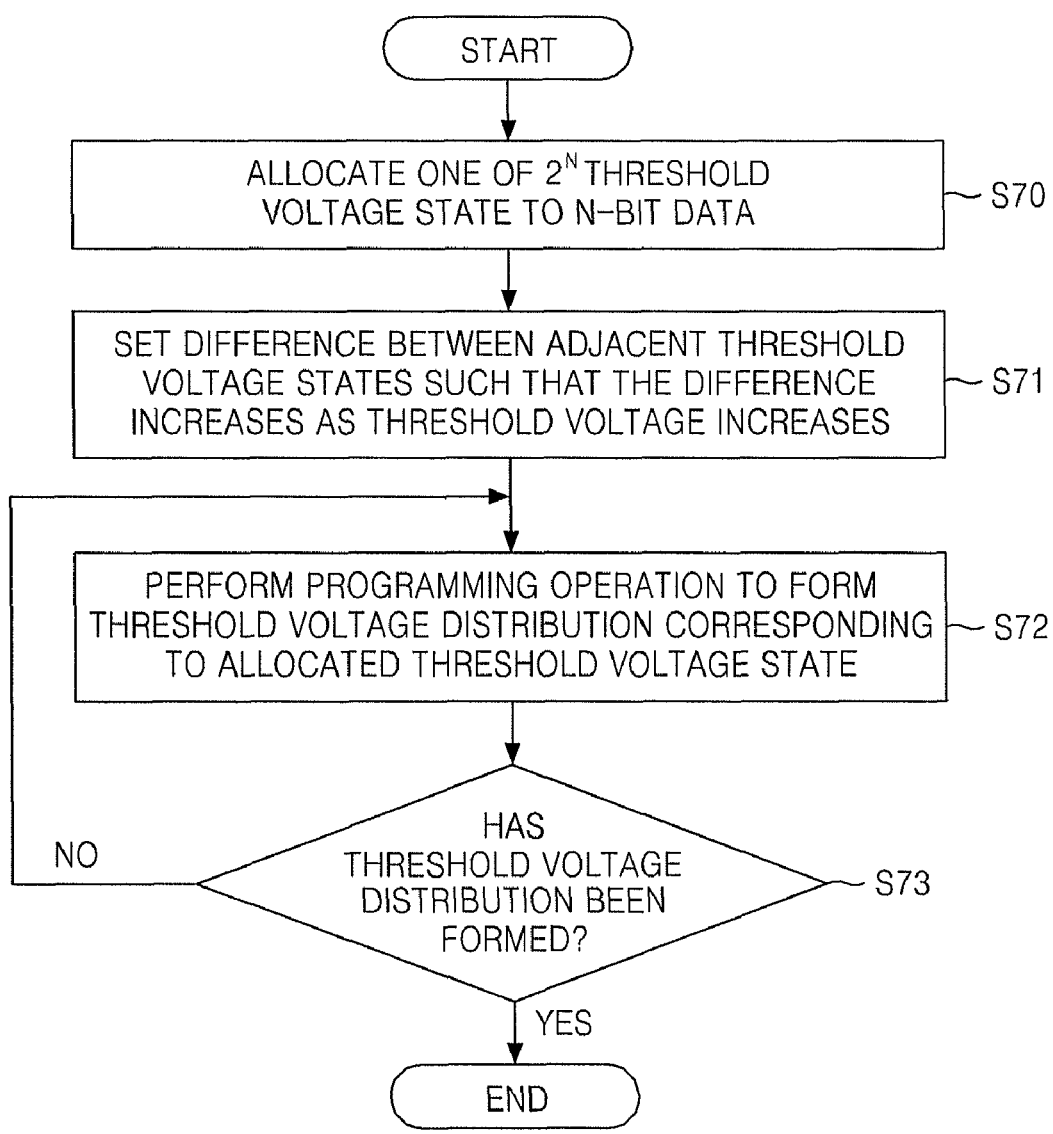
FIG. 7 illustrates a flowchart of a programming method of a nonvolatile memory device using interleaving technology according to one or more embodiments.

FIG. 7 illustrates a flowchart of an exemplary embodiment of a programming method of the nonvolatile memory device 100 using interleaving technology. The programming method will be described sequentially with reference to FIGS. 1 and 7 below.

Upon receiving N-bit data, the first controller 122 may allocate one of $2^N$ threshold voltage states to the N-bit data (S70). The second controller 124 may set a difference between adjacent threshold voltage states such that the difference between adjacent threshold voltage states increases as a threshold voltage increases (S71).

Thereafter, the programming unit 126 may perform a programming operation to form a threshold voltage distribution corresponding to the allocated threshold voltage state (S72). The verification unit 128 may verify whether the threshold voltage distribution corresponding to the allocated threshold voltage state has been formed (S73). When the threshold voltage distribution has not been formed, the nonvolatile memory device 100 may repeat the programming operation (S72) and the verification (S73).

One or more embodiments of the present inventive concept can be embodied in hardware, software, firmware and/or a combination thereof. When the programming method of the nonvolatile memory device 100 using interleaving technology according to some embodiments of the present inventive concept is embodied in software, it can be embodied as computer readable codes and/or programs on a computer readable recording medium. The programming method of the nonvolatile memory device 100 using interleaving technology according to some embodiments of the present inventive concept may be embodied by executing the computer program for executing the programming method of the nonvolatile memory device stored in the computer readable recording medium.

The computer readable recording medium is any data storage device that can store data which can be thereafter read by a computer system. More particularly, the computer readable recording medium may be, e.g., a tangible, non-transitory recording medium. Examples of the computer readable recording medium include read-only memory (ROM), random-access memory (RAM), CD-ROMs, magnetic tapes, floppy disks, and optical data storage devices. The program codes for executing a method of upgrading an operation program in an RFID system may be transmitted in the form of carrier waves (such as data transmission through the Internet).

The computer readable recording medium can also be distributed over network coupled computer systems so that the computer readable code is stored and/or executed in a distributed fashion. Also, functional programs, codes, and/or code segments for realizing embodiments can be easily construed by programmers skilled in the art to which the embodiments pertain.

Figure 8:
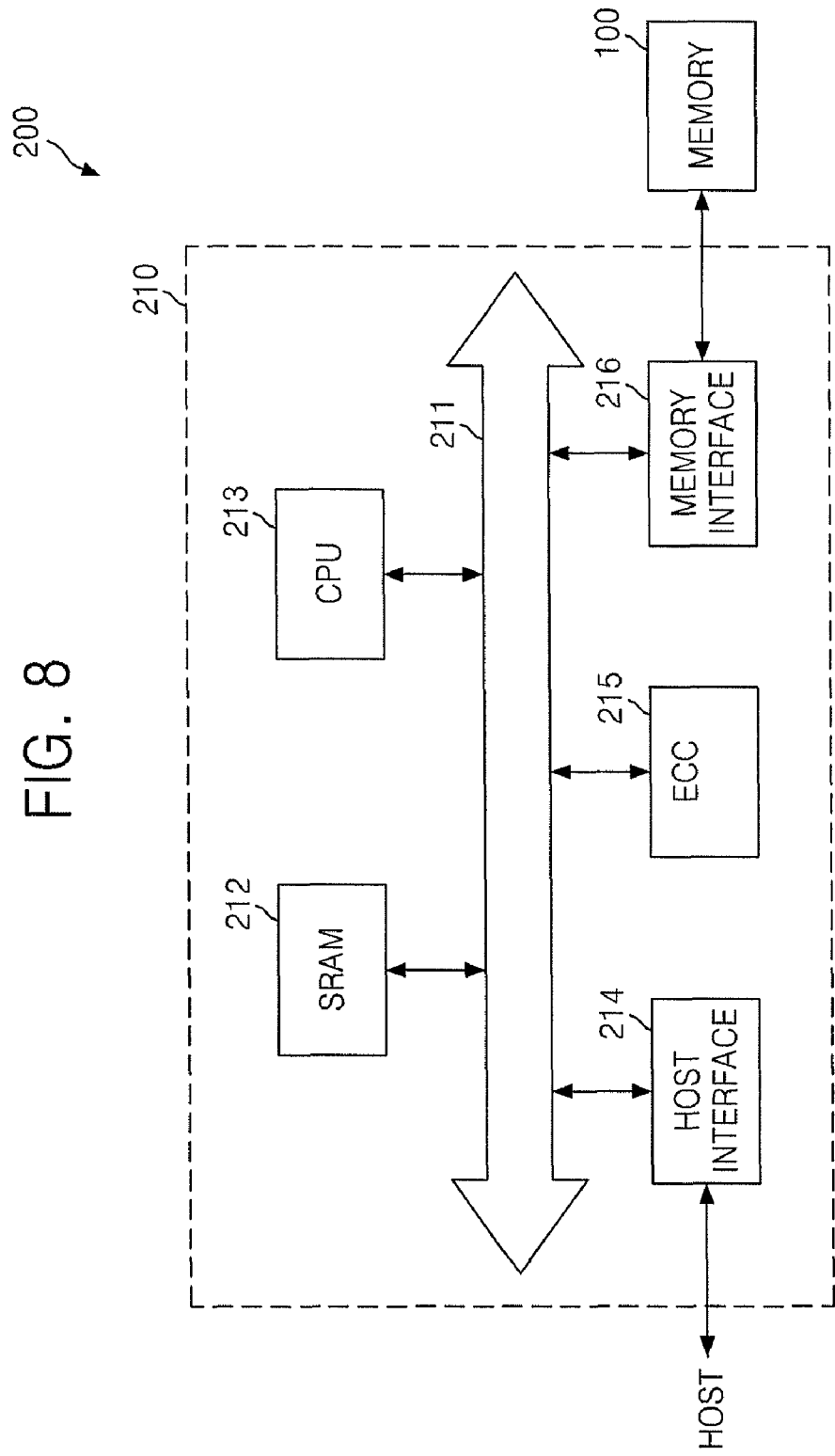
FIG. 8 illustrates a block diagram of a nonvolatile memory system according to one or more embodiments.

FIG. 8 illustrates a block diagram of an exemplary embodiment of a nonvolatile memory system 200. The nonvolatile memory system 200 may be a memory card or a solid state disk (SSD), which includes the nonvolatile memory device 100 that supports high capacity of data storage. The nonvolatile memory system 200 also includes a memory controller 210 that controls overall data exchange between a host and the nonvolatile memory device 100. The nonvolatile memory device 100 may be a flash memory device that generates an optical verify-read voltage corresponding to a word line or a data page to perform a read operation. Elements of the memory controller 210 may be connected to one another through a bus 211. The nonvolatile memory system 200 may read data having high reliability from the nonvolatile memory device 100, so that the nonvolatile memory system 200 may have improved and/or high reliability relative to comparable conventional systems.

A static random access memory (SRAM) 212 may be used as an operation memory of a central processing unit (CPU) 213. A host interface 214 may include a data exchange protocol of the host connected to the nonvolatile memory system 200. An error correction circuit (ECC) 215 may detect and correct errors included in data read from the nonvolatile memory device 100.

A memory interface 216 may interface the memory controller 210 with the nonvolatile memory device 100. The CPU 213 may control overall operations for data exchange between the memory controller 210 and the nonvolatile memory device 100. Although not shown in FIG. 8, the nonvolatile memory system 200 may further include a read-only memory (ROM) storing code data for interface with the host.

In one or more embodiments, the nonvolatile memory device 100 may output data with a low BER, so that a burden on the ECC 215 may be reduced in the nonvolatile memory system 200.

Although not shown in FIG. 8, it will be apparent to those of ordinary skill in the art that the nonvolatile memory system 200 may be combined with an application chipset, a camera image processor (CIS), or a mobile dynamic random access memory (DRAM) to be provided as a storage device for information processing systems.

In one or more embodiments, the nonvolatile memory device 100 and the nonvolatile memory system 200 may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and/or Wafer-Level Processed Stack Package (WSP), among others.

Figure 9:
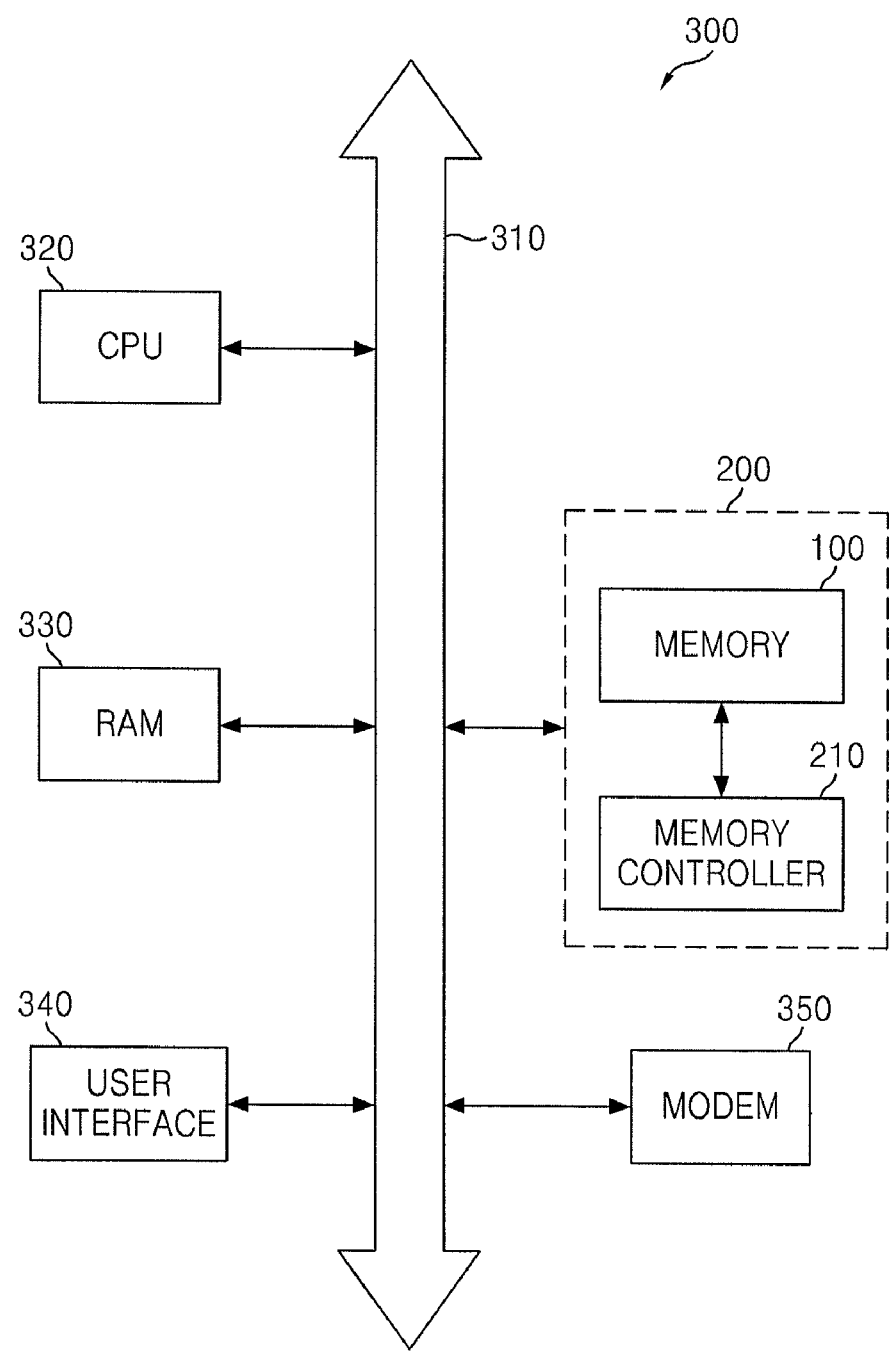
FIG. 9 illustrates a block diagram of an information processing system according to one or more embodiments.

FIG. 9 illustrates a block diagram of an information processing system 300 according to one or more embodiments. The information processing system 300 may include the nonvolatile memory system 200 including the memory controller 210 and the nonvolatile memory device 100, a CPU 320, a RAM 330, a user interface 340, and a modem 350, which may be electrically connected to a bus 310.

Data received through the user interface 340 or data processed by the CPU 320 may be stored in the nonvolatile memory device 100 through the memory controller 210. At this time, the CPU 320 and other elements, which correspond to a host including the nonvolatile memory system 200, may be provided with data having high reliability from the nonvolatile memory system 200.

As described above, in one or more embodiments, a number of errors may be substantially and/or completely equalized for all intersections among all threshold voltage states in a voltage window at the EOL of a nonvolatile memory device using interleaving technology, so that the total number of errors at the EOL may be reduced and/or minimized and reliability of the nonvolatile memory device may be increased relative to comparable conventional devices.

Figure 10:
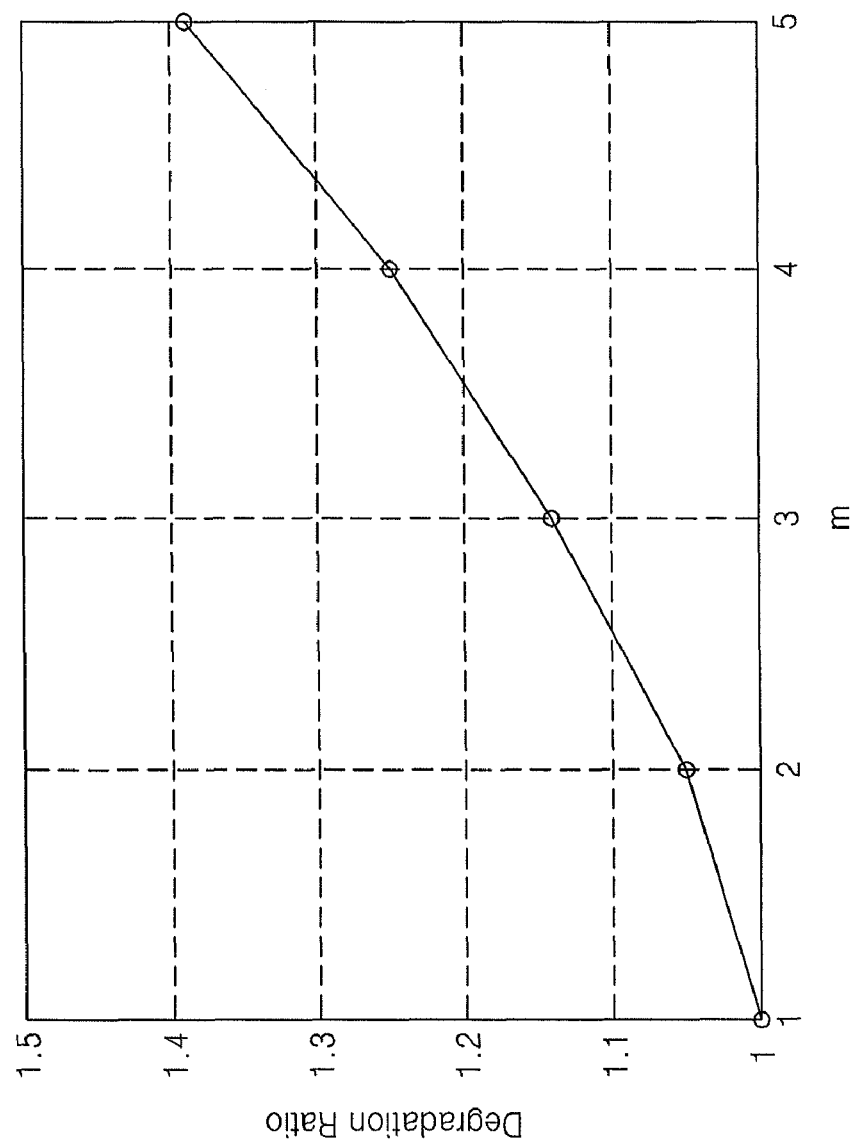
FIG. 10 illustrates a graph showing the comparison of reliability between a nonvolatile memory device according to one or more embodiments and a conventional nonvolatile memory device based on errors occurring between adjacent states.
Figure 11:
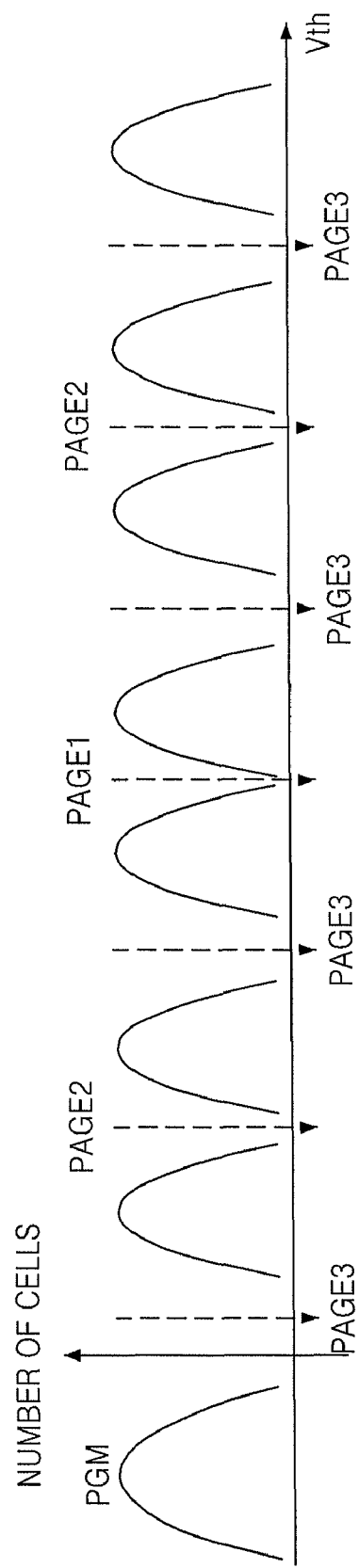
FIG. 11 illustrates a graph of threshold voltage states of multi-level cells right after a programming operation of a conventional nonvolatile memory device that adjusts a verify-read voltage to equalize a bit error rate (BER) for all pages at the EOL.
Figure 12:
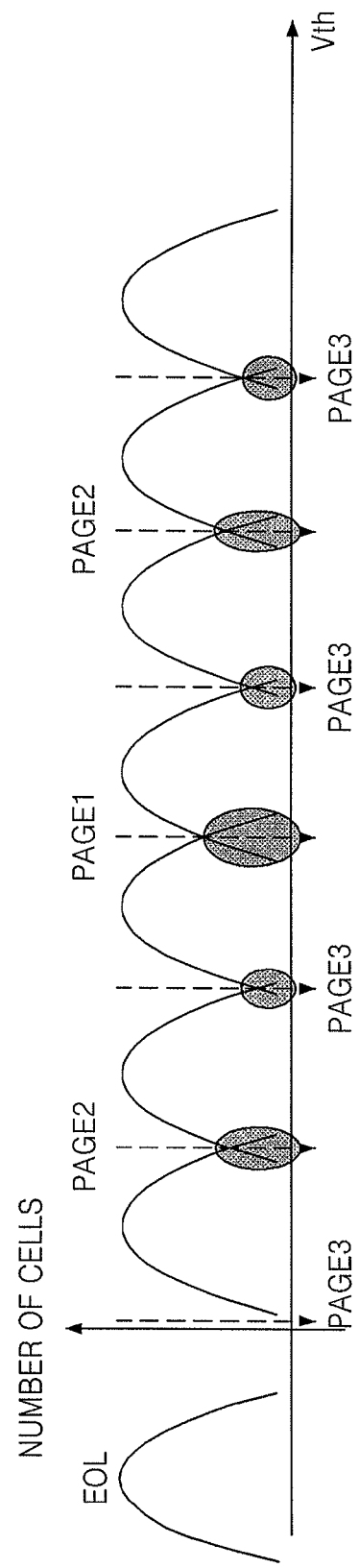
FIG. 12 illustrates a graph showing threshold voltage states of multi-level cells at the EOL of the conventional nonvolatile memory device of FIG. 11.

FIG. 10 illustrates a graph showing a comparison of reliability between the nonvolatile memory device 100 and a conventional nonvolatile memory device based on errors occurring between adjacent states. FIG. 11 illustrates a graph showing threshold voltage states of multi-level cells right after a programming operation of a conventional nonvolatile memory device (not shown) that adjusts a verify-read voltage to equalize a BER for all pages at the EOL. FIG. 12 illustrates a graph showing threshold voltage states of multi-level cells at the EOL of the conventional nonvolatile memory device of FIG. 11.

Referring to FIG. 11, the difference between threshold voltage states increases as the number of pages increases, taking into consideration that the number of read operations increases as the number of pages increases. This is because the increase of the number of read operations may lead to an increase in the number of errors.

Unlike the exemplary embodiments illustrated in FIG. 3 where the intersections have the same area at the EOL, the areas of intersections (error occurring regions) among threshold voltage states are not the same at the EOL of the conventional nonvolatile memory device, as illustrated in FIG. 12. However, the sum of the areas of intersections among threshold voltage states for each page may be equalized for all pages, so that a number of errors may be substantially equalized for all pages.

The conventional nonvolatile memory device illustrated in FIGS. 11 and 12 may control a verify-read voltage to equalize the number of errors for all pages at the EOL. As described above, it is difficult to control the verify-read voltage and this difficulty increases as the number of threshold voltage states increases. The conventional nonvolatile memory device illustrated in FIGS. 11 and 12 is inferior to the nonvolatile memory device 100 at least with regard to BER.

FIG. 10 illustrates a graph showing the comparison of reliability between the exemplary embodiment of the nonvolatile memory device 100 and the conventional nonvolatile memory device illustrated in FIGS. 11 and 12 based on errors occurring between adjacent states. In detail, FIG. 10 shows a ratio of the BER of the conventional nonvolatile memory device to the BER of the nonvolatile memory device 100 with respect to the number of bits that can be stored in a multi-level memory cell under predetermined conditions. Referring to FIG. 10, as the number of bits stored in the multi-level memory cell increases, the reliability (i.e., BER) of the conventional nonvolatile memory device degrades compared to that of the nonvolatile memory device 100 employing one or more aspects of embodiments described herein.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile memory device using interleaving technology, the nonvolatile memory device comprising:
   a first controller configured to allocate one of $2^N$ threshold voltage states to N-bit data where N is 2 or a natural number greater than 2;
   a second controller configured to set a difference between adjacent threshold voltage states among the $2^N$ threshold voltage states so that the difference increases as a threshold voltage increases; and
   a programming unit configured to form a threshold voltage distribution state corresponding to the allocated threshold voltage state and to program the N-bit data to a multi-level cell,
   wherein the second controller is configured to control the difference between the adjacent threshold voltage states to equalize the number of read errors for all intersections among the $2^N$ threshold voltage states at end of life.

2. The nonvolatile memory device as claimed in claim 1, wherein the second controller is configured to control the difference between the adjacent threshold voltage states based on a characteristic of threshold voltage shift of the multi-level cell at the end of life.

3. The nonvolatile memory device as claimed in claim 2, wherein the second controller is configured to control the difference between the adjacent threshold voltage states considering a change in a threshold voltage distribution state corresponding to each threshold voltage state, which occurs based on a coupling effect and/or a program disturbance by other threshold voltage states.

4. The nonvolatile memory device as claimed in claim 2, wherein the second controller is configured to control a difference between a lowest threshold voltage state and its adjacent threshold voltage state considering a change in a threshold voltage distribution state, which occurs based on program disturbance by other threshold voltage states.

5. The nonvolatile memory device as claimed in claim 1, wherein the nonvolatile memory device is a flash memory including a plurality of multi-level cells.

6. The nonvolatile memory device as claimed in claim 1, wherein the first controller is configured to allocate one of the $2^N$ threshold voltage states to the N-bit data using gray coding.

7. The nonvolatile memory device as claimed in claim 1, further comprising a verification unit configured to compare a threshold voltage of the multi-level cell with a verify-read voltage and to verify whether the threshold voltage distribution state corresponding to the allocated threshold voltage state has been formed.

8. The nonvolatile memory device as claimed in claim 7, wherein the second controller controls the difference between the adjacent threshold voltage states by adjusting the verify-read voltage.

9. The nonvolatile memory device as claimed in claim 1, further comprising:
a detection unit configured to compare a threshold voltage of the multi-level cell with a detected voltage and to detect a threshold voltage shift characteristic of the multi-level cell; and
a verify-read voltage controller configured to change a verify-read voltage for the multi-level cell based on the threshold voltage shift characteristic of the multi-level cell.

10. A memory system, comprising:
the nonvolatile memory device as claimed in claim 1; and
a memory controller configured to control data exchange between the nonvolatile memory device and a host.

11. A programming method of nonvolatile memory device using interleaving technology, the programming method comprising:
allocating one of $2^N$ threshold voltage states to N-bit data where N is 2 or a natural number greater than 2;
setting a difference between adjacent threshold voltage states among the $2^N$ threshold voltage states so that the difference increases as a threshold voltage increases; and
programming the N-bit data to a multi-level cell by forming a threshold voltage distribution state corresponding to the allocated threshold voltage state,
wherein setting a difference between adjacent threshold voltage states includes controlling the difference between the adjacent threshold voltage states to equalize the number of read errors for all intersections among the $2^N$ threshold voltage states at end of life.

12. The programming method as claimed in claim 11, wherein setting a difference between adjacent threshold voltage states includes controlling the difference between the adjacent threshold voltage states based on a characteristic of threshold voltage shift of the multi-level cell at the end of life.

13. The programming method as claimed in claim 12, wherein setting a difference between adjacent threshold voltage states includes controlling the difference between the adjacent threshold voltage states considering a change in a threshold voltage distribution state corresponding to each threshold voltage state, which occurs based on a coupling effect and/or a program disturbance by other threshold voltage states.

14. The programming method as claimed in claim 12, wherein setting a difference between adjacent threshold voltage states comprises controlling a difference between a lowest threshold voltage state and its adjacent threshold voltage state considering a change in a threshold voltage distribution state, which occurs based on program disturbance by other threshold voltage states.

15. The programming method as claimed in claim 11, wherein the nonvolatile memory device is a flash memory including a plurality of multi-level cells.

16. The programming method as claimed in claim 11, wherein allocating one of $2^N$ threshold voltage states to N-bit data includes allocating one of the $2^N$ threshold voltage states to the N-bit data using gray coding.

17. The programming method as claimed in claim 11, further comprising comparing a threshold voltage of the multi-level cell with a verify-read voltage and verifying whether the threshold voltage distribution state corresponding to the allocated threshold voltage state has been formed.

18. The programming method as claimed in claim 17, wherein setting a difference between adjacent threshold voltage states includes controlling the difference between the adjacent threshold voltage states by adjusting the verify-read voltage.

19. The programming method as claimed in claim 11, further comprising:
comparing a threshold voltage of the multi-level cell with a detected voltage and to detect a threshold voltage shift characteristic of the multi-level cell; and
changing a verify-read voltage for the multi-level cell based on the threshold voltage shift characteristic of the multi-level cell.

20. A non-transitory computer readable storage medium including executable code that is operable to perform operations according to the programming method as claimed in claim 11.

* * * * *